US008788015B2

(12) United States Patent
Jain et al.

(10) Patent No.: US 8,788,015 B2
(45) Date of Patent: Jul. 22, 2014

(54) METHOD OF RAPIDLY VISUALIZING ESSENTIAL NEURAL PATHWAYS

(75) Inventors: Surbhi Jain, Tampa, FL (US); Steven Brem, Tampa, FL (US)

(73) Assignee: University of South Florida, Tampa, FL (US)

( * ) Notice: Subject to any disclaimer, the term of this patent is extended or adjusted under 35 U.S.C. 154(b) by 216 days.

(21) Appl. No.: 13/366,579

(22) Filed: Feb. 6, 2012

(65) Prior Publication Data

US 2012/0172705 A1    Jul. 5, 2012

Related U.S. Application Data

(63) Continuation of application No. PCT/US2010/044572, filed on Aug. 5, 2010.

(60) Provisional application No. 61/231,378, filed on Aug. 5, 2009.

(51) Int. Cl.
*A61B 5/055*    (2006.01)

(52) U.S. Cl.
USPC ............................. 600/410; 600/407; 600/425

(58) Field of Classification Search
CPC ........................................................ A61B 5/055
USPC .......................................... 600/407, 410, 425
See application file for complete search history.

(56) References Cited

U.S. PATENT DOCUMENTS

| 2004/0053332 A1 | 3/2004 | Ross et al. |
| 2006/0017749 A1 | 1/2006 | McIntyre et al. |
| 2006/0084858 A1 | 4/2006 | Marks |
| 2008/0205733 A1 | 8/2008 | Laidlaw et al. |

OTHER PUBLICATIONS

Hiltunen et al. Diffusion tensor imaging and tractography of distal peripheral nerves at 3 T. 2005. Clinical Neurophysiology (116):2315-2323.*

(Continued)

*Primary Examiner* — Peter Luong
(74) *Attorney, Agent, or Firm* — Andriy Lytvyn; Smith & Hopen, P.A.

(57) ABSTRACT

A method of optimizing pre-operative procedures in the field of neurosurgery. The method facilitates the identification of essential fiber tract pathways that must be avoided when planning and performing an operation, thereby increasing surgical safety and avoiding complications. The method includes the combined use of four variables in Diffusion Tensor Imaging (DTI)-Fiber Tracking (FT) of projection fibers in the brain. These variables include Jain-Brem™ fractional anisotropy constant for tractography (JB-FACT), Jain-Brem™ fiber length (JB-FL), subcentimeter size placement of regions of interest (ROI), and the placement of ROIs to cover the anatomical pathway of projection fibers. JB-FACT and JB-FL provide rapid, reproducible tracking for projection fibers in the brain.

7 Claims, 22 Drawing Sheets

(56) References Cited

OTHER PUBLICATIONS

International Preliminary Report on Patentability, mailing date of Mar. 3, 2011, for International application No. PCT/US2010/044572 filed on Aug. 5, 2010.

BrainLAB Neurosurgery Solutions, VectorVision, http://www.brainlab.com/download/pdf/VectorVisionLink.pdf, accessed Apr. 30, 2012.

BrainLAB, iPlan Flow, http://www.brainlab.com/download/pdf/iPlanFlow.pdf, accessed Apr. 30, 2012.

DynaSuite, neuro, http://www.invivocorp.com/avs/neuro.php, accessed Apr. 30, 2012.

Takagi T, Nakamura M, Yamada M, Hikishima K, Momoshima S, Fujiyoshi K, Shibata S, Okano HJ, Toyama Y, Okano H. Abstract of: Visualization of peripheral nerve degeneration and regeneration: monitoring with diffusion tensor tractography. Neuroimage. Feb. 1, 2009;44(3):884-92. doi: 10.1016/j.neuroimage.2008.09.022. Epub Oct. 2, 2008.

* cited by examiner

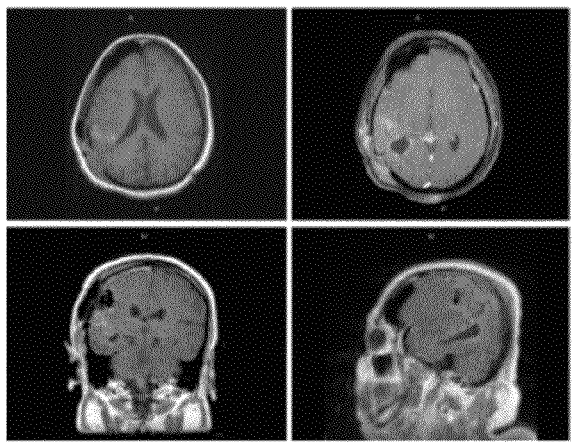
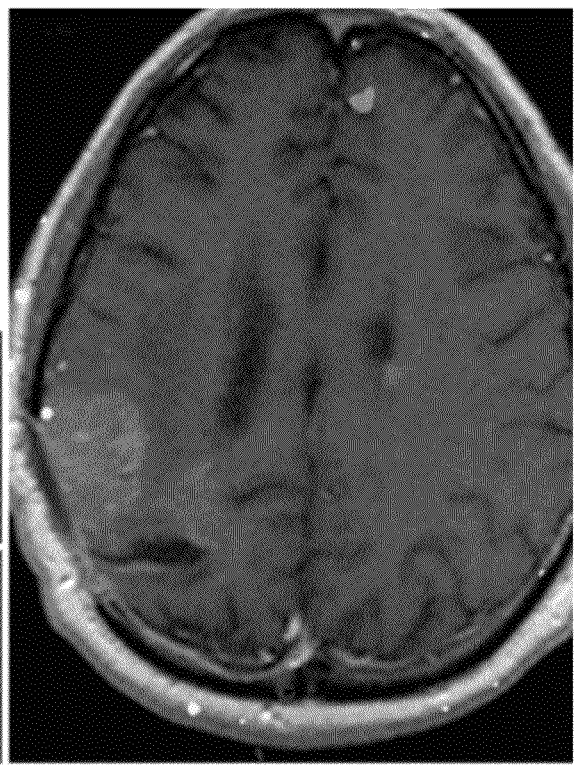
FIG. 25A
FIG. 25B

METHOD OF RAPIDLY VISUALIZING ESSENTIAL NEURAL PATHWAYS

CROSS REFERENCE TO RELATED APPLICATIONS

This application is a continuation of currently PCT application PCT/US2010/044572 filed Aug. 5, 2010, which claims priority to U.S. Provisional Patent Application No. 61/231,378, filed Aug. 5, 2009 which are hereby incorporated by reference.

FIELD OF INVENTION

This invention relates to computer-assisted surgery in the field of neurosurgery.

BACKGROUND

Existing navigation software systems in the field of neurosurgery related, such as
BrainLab's VectorVision®, have a steep learning curve. There is a long-felt need for surgical planning software that reduces complexity and likelihood of individual error.
BrainLab's iPLAN® is diffusion tensor imaging (DTI)—fiber tracking (FT) software that identifies and tracks white matter fibers of the brain and recognizes different fiber bundles, such as commissural/association and projection fibers, and their location in relation to a brain tumor to assist a surgeon with surgical planning The software provides excellent visualization, isolation, and extraction of the desired fiber bundles and is used as a three dimensional navigation system, which is continuously updated during surgery to provide surgical coordinates and their relation to the map of the fiber tracts.

The map of the fiber tracts can significantly alter the surgical approach and can maximize the outcome of the surgery for a patient. However, the prolonged amount of time taken to use the software in preparation for surgery is well known. This drawback discourages its routine use in the cranial surgery despite its obvious advantage and application in improving the surgical outcome.

SUMMARY OF INVENTION

The method addresses an important unmet need in the field of neurosurgery. The present invention advances the safety, efficiency, and precision of brain tumor surgery with fast-track piloting in the critically important, eloquent areas of the brain.

The use of Diffusion Tensor Imaging (DTI)—Fiber Tracking (FT) software, such as BrainLab's iPLAN, BrainLab's Vector Vision, and Invivo's DynaSuite Nero, involves isolating important fiber bundles to obtain a three-dimensional orientation in the brain. The present method can be integrated with any of these or other similar advanced platforms and reduces surgical planning time by up to 95%. The method facilitates the identification of essential fiber tract pathways to avoid when planning and performing an operation, thereby increasing surgical safety and avoiding complications. In addition, it maximizes functional outcomes and enhances quality of life for patients with brain tumors.

The present invention provides combined use of the following constants in DTI-FT of projection fibers in the brain:
Jain-Brem™ Fractional Anisotropy Constant for Tractography (JB-FACT) threshold constant of about 0.26
Jain-Brem™ fiber length (JB-FL) constant of about 60 mm
Subcentimeter size placement of regions of interest (ROI)
Placement of ROIs to cover the anatomical pathway of projection fibers
The JB-FA and JB-FL constants provide rapid, reproducible tracking of the brain's projection fibers, such as corticospinal tracts, corticobulbar tracts, and corticopontine tracts.

BRIEF DESCRIPTION OF THE DRAWINGS

For a fuller understanding of the invention, reference should be made to the following detailed description, taken in connection with the accompanying drawings, in which:

FIG. 25 is a series of postoperative MR images (A) and a preoperative fMRI motor overlay (B). There were no postoperative deficits and there was a reduced tumor burden as a result of the surgery.

DETAILED DESCRIPTION OF THE PREFERRED EMBODIMENT

Figure 1:
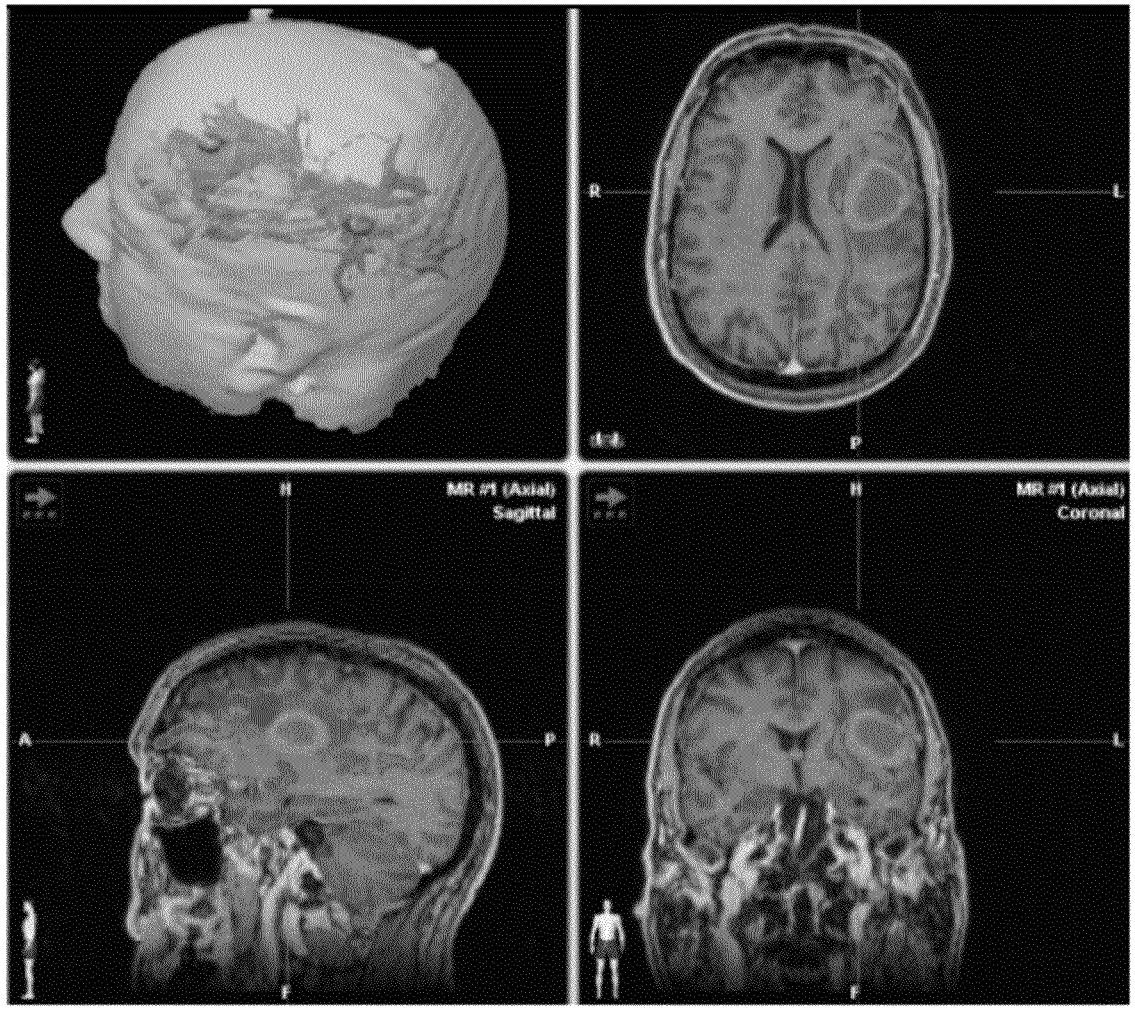
FIG. 1 is a series of MR images of the brain highlighting speech fibers in relatively close proximity to a tumor.
Figure 2:
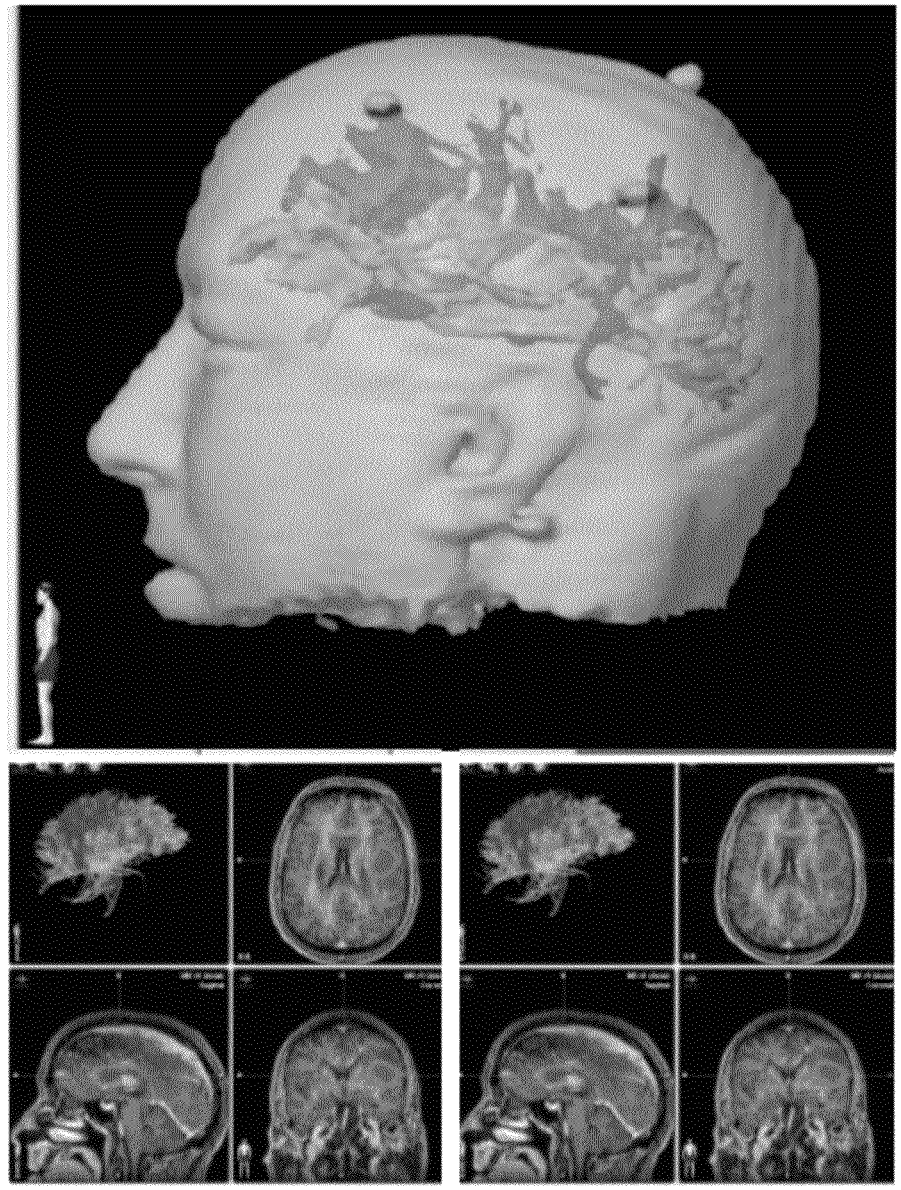
FIG. 2 is a series of MR images mapping superior and inferior longitudinal speech fibers.
Figure 3A:
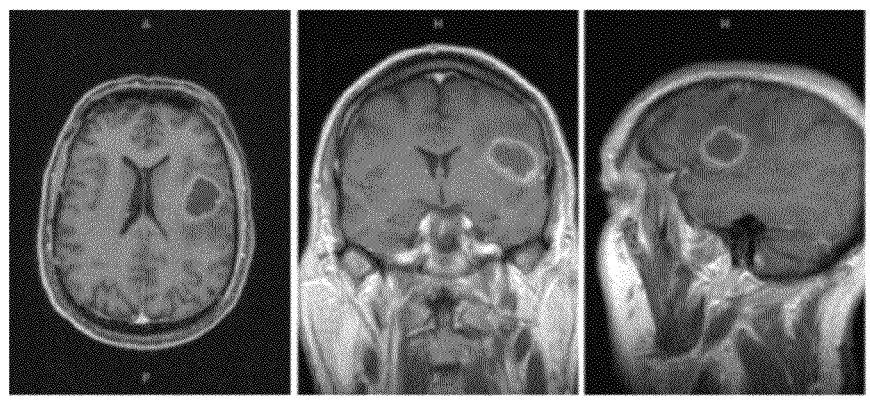
FIG. 3 is a series of preoperative (FIG. 3A) & postoperative (FIG. 3B) w/w/o contrast MR images showing subtotal resection.
Figure 3B:
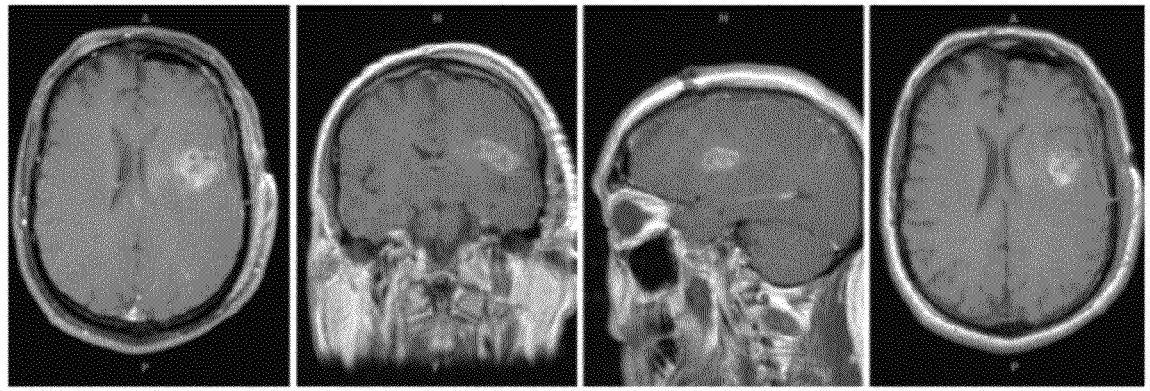
Figure 4:
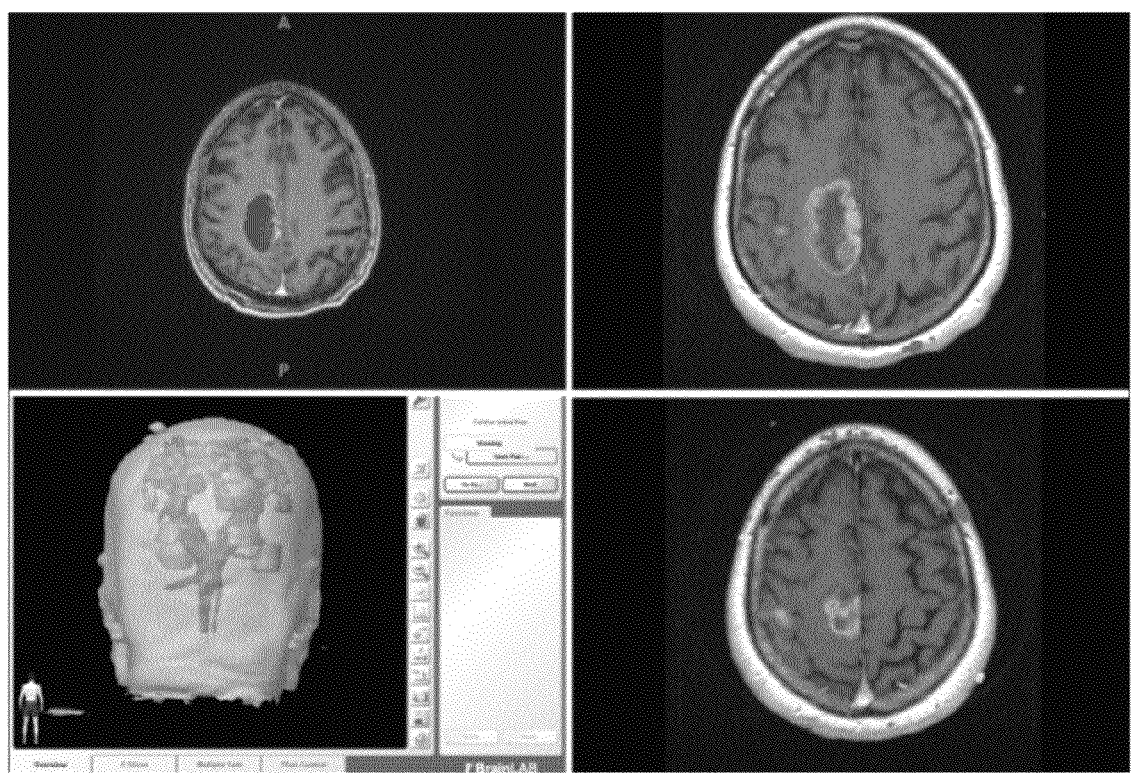
FIG. 4 is a series of MR images of the motor cortex, displaced laterally, showing
WM fibers consolidated in the subcortical area near the posterior, lateral, and inferior part of the tumor in the three-dimensional plane.
Figure 5:
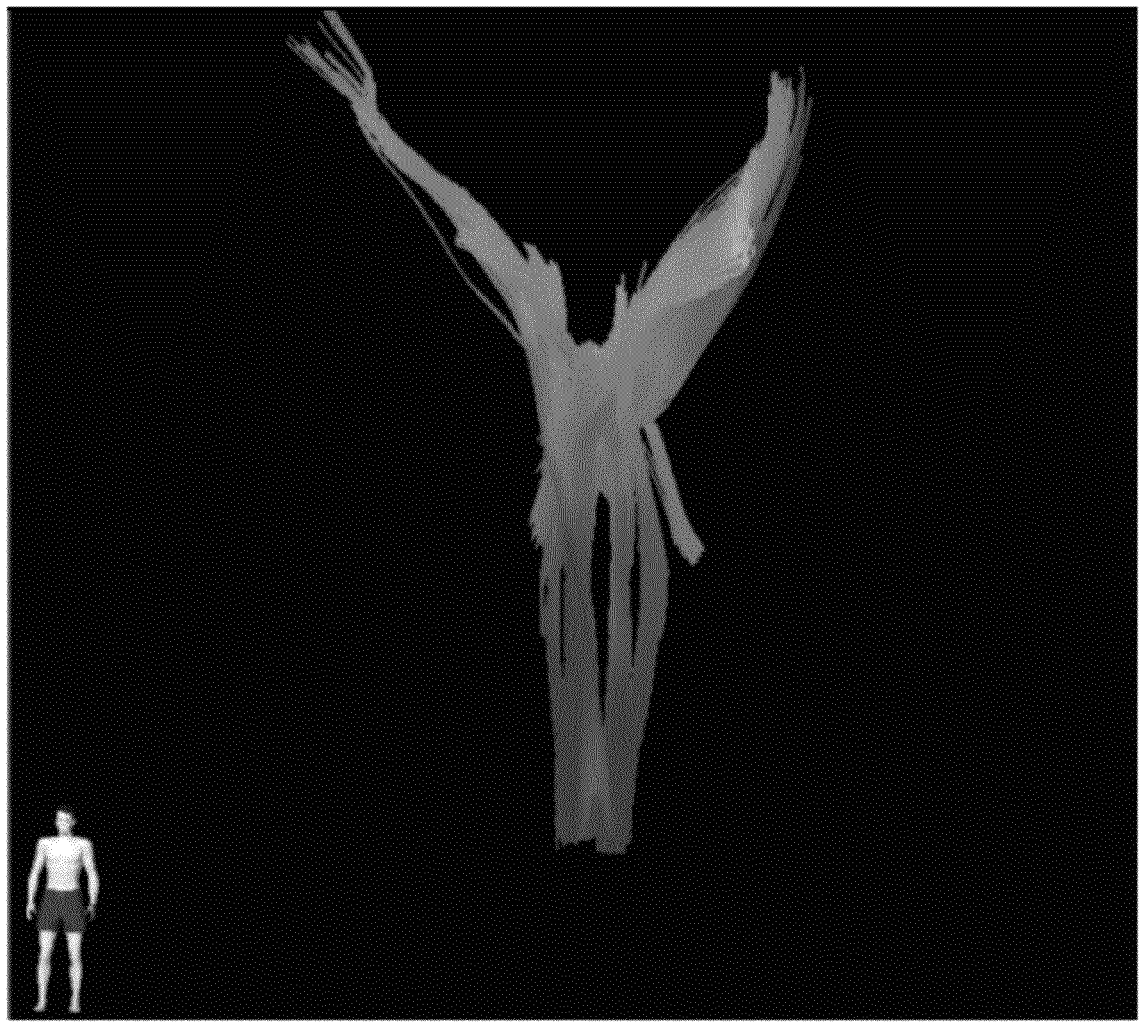
FIG. 5 is an image showing displacement of CST without significant loss in fiber thickness.
Figure 6:
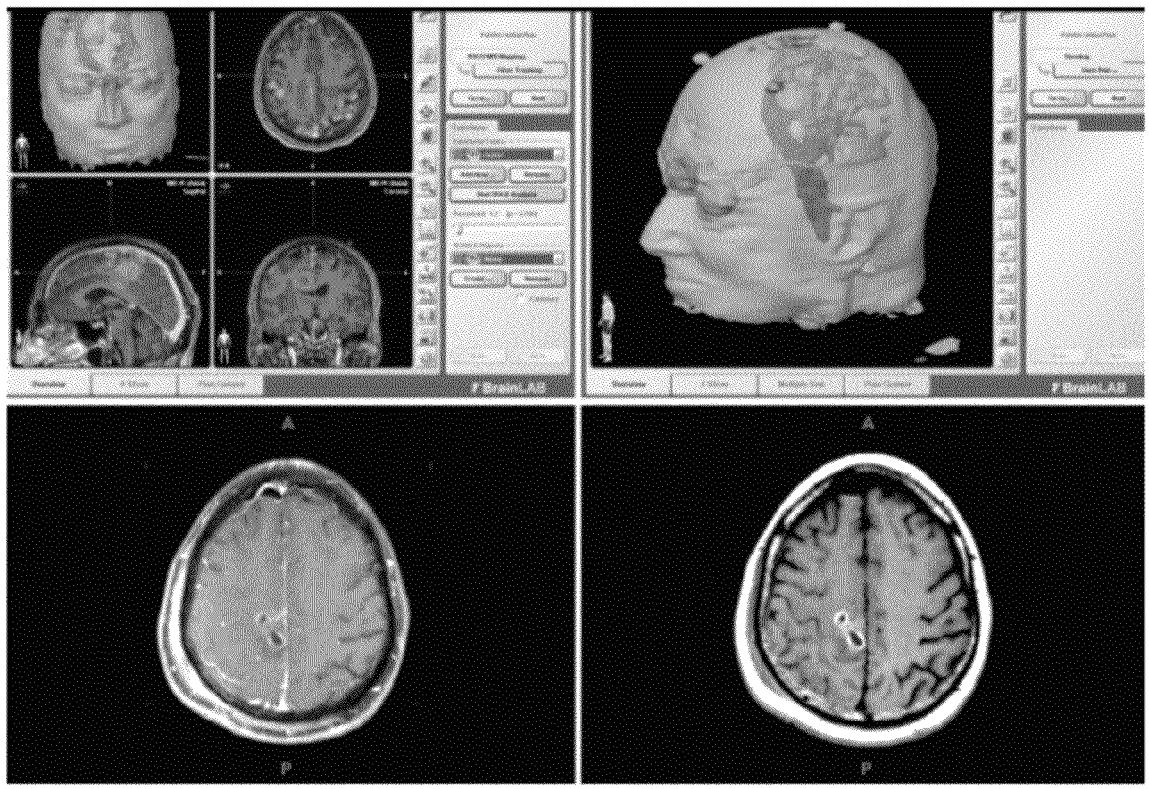
FIG. 6 is a series of preoperative MR-navigation images and postoperative axial w/w/o contrast scans showing the gross total resection of the tumor.
Figure 7:
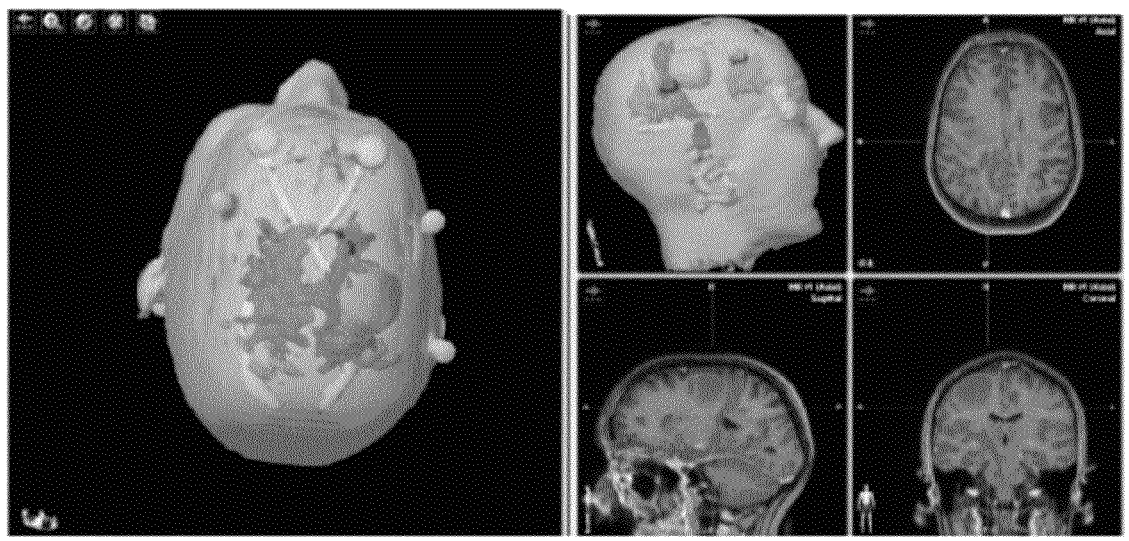
FIG. 7 is a series of MR images showing the close proximity of the tumor with the primary motor cortex.
Figure 8:
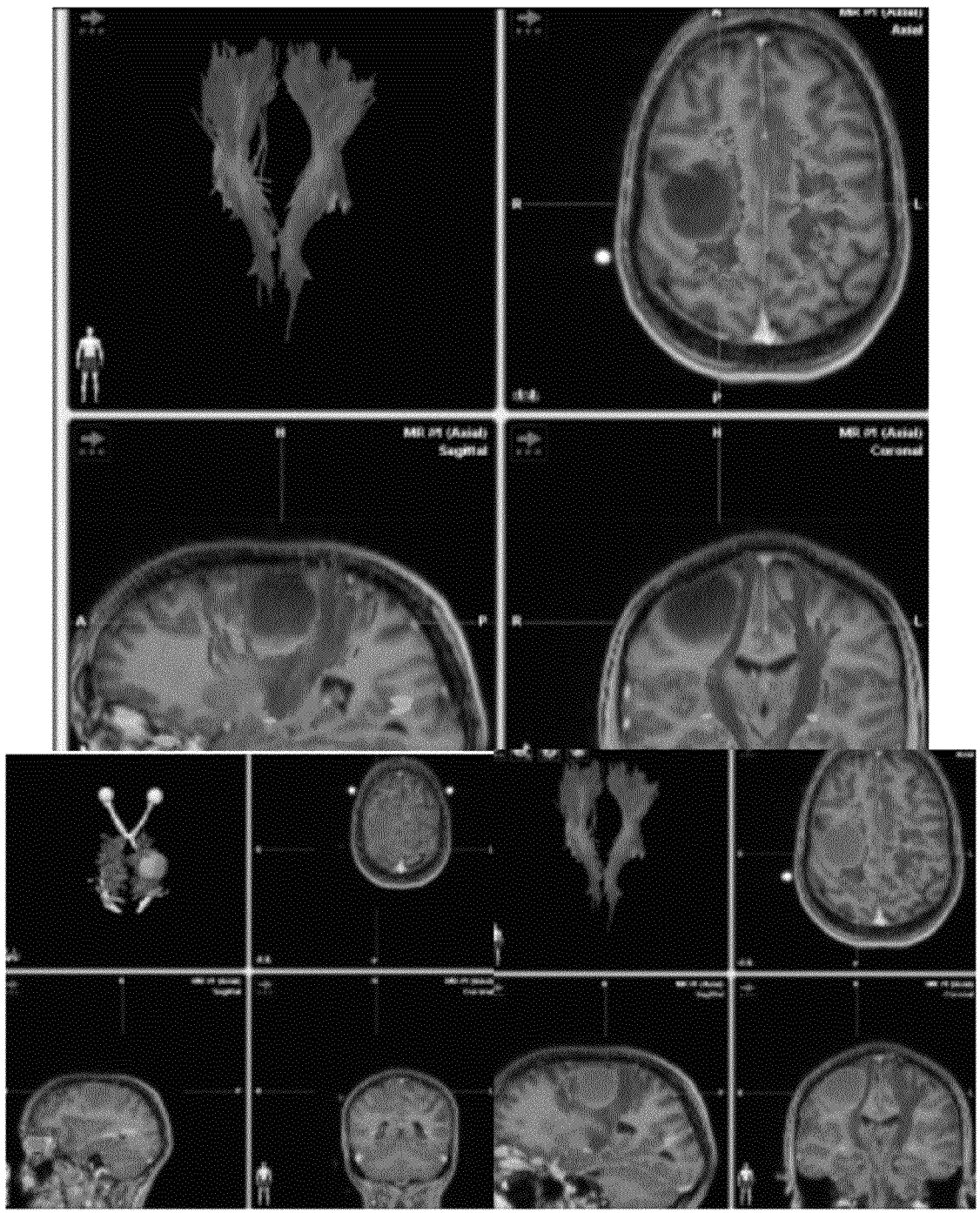
FIG. 8 is a series of MR images demonstrating that the absence of clinical signs and the DTI study suggest fiber tract infiltration and displacement without compression or disruption.
Figure 9:
FIG. 9 is an image showing relatively no change in fiber tract architecture as compared to the normal side.
Figure 10:
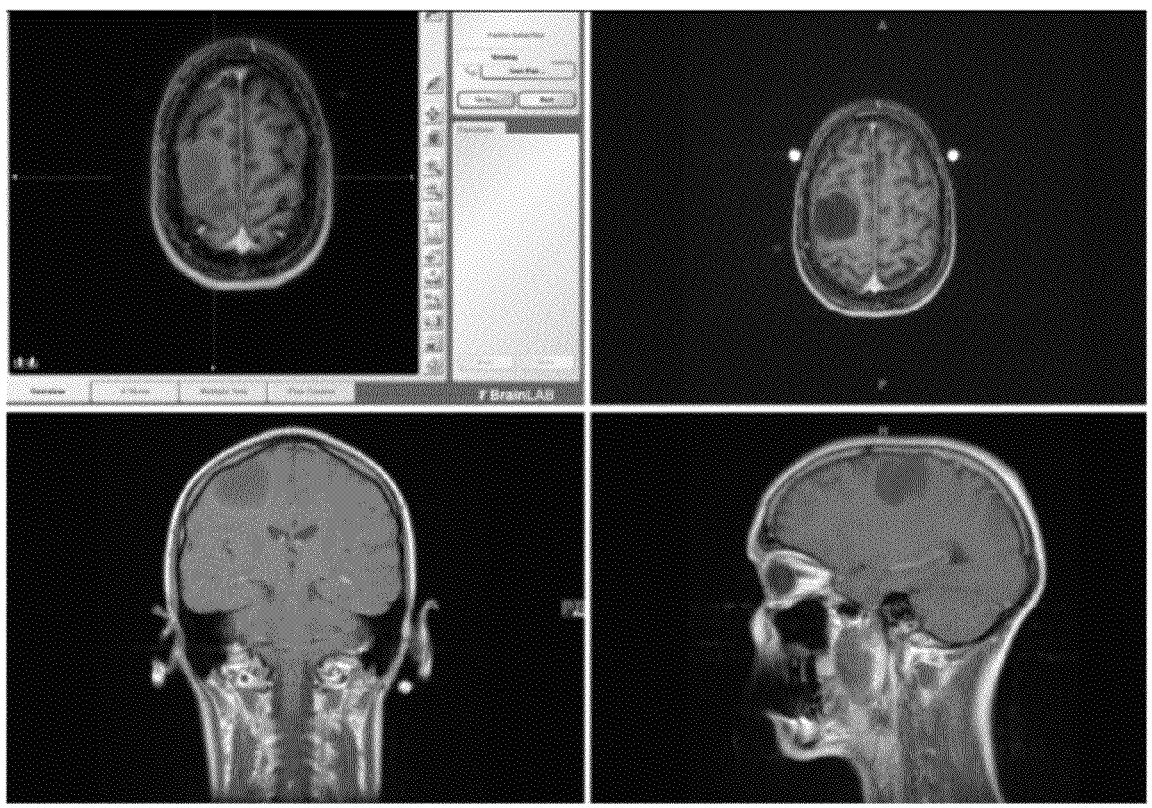
FIG. 10 is a series of preoperative MR images from the study.
Figure 11:
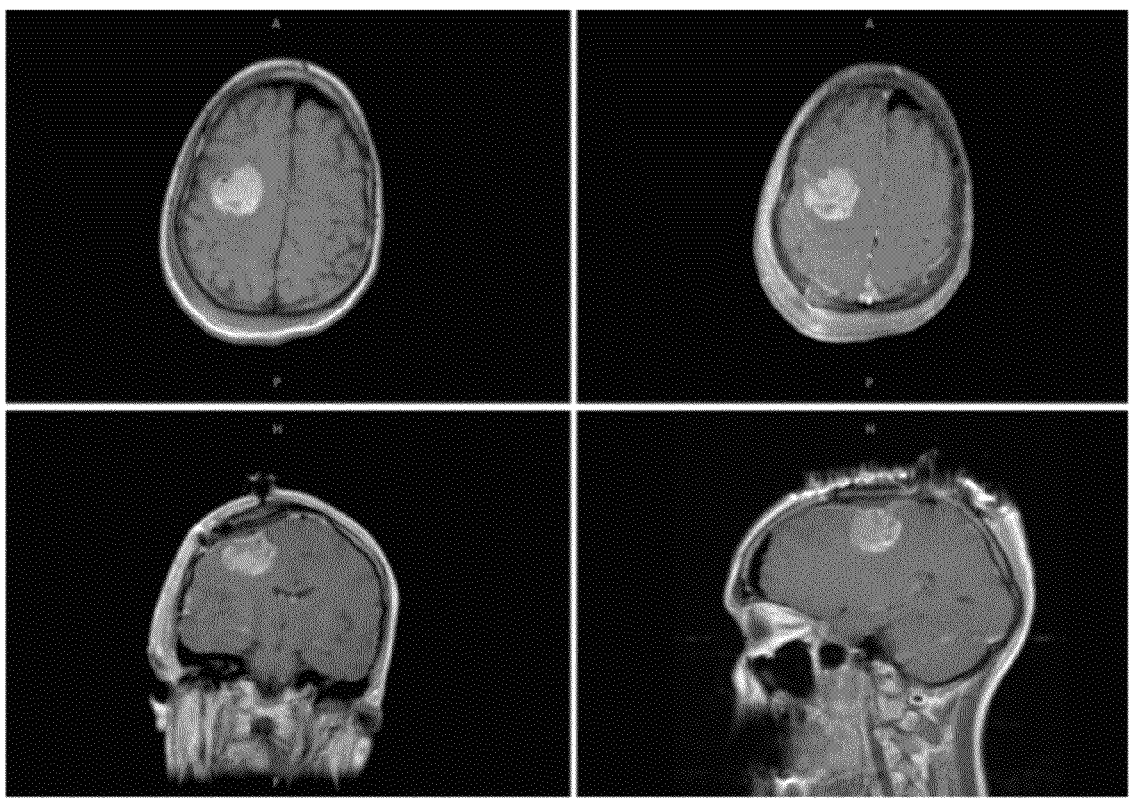
FIG. 11 is a series of postoperative MR studies with and without contrast.
Figure 12:
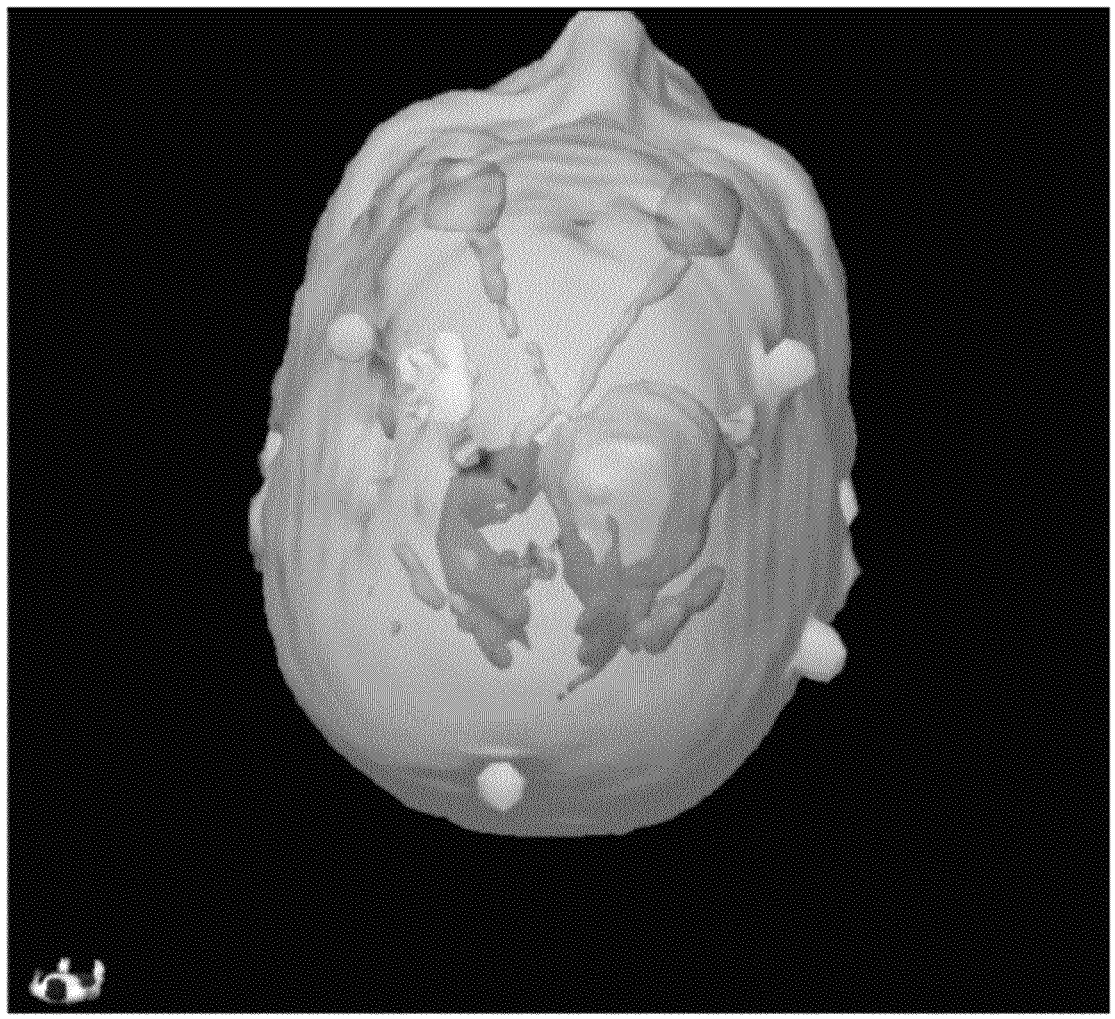
FIG. 12 is an image showing a type 'C' cortical, type 'B' subcortical large cystic tumor.
Figure 13:
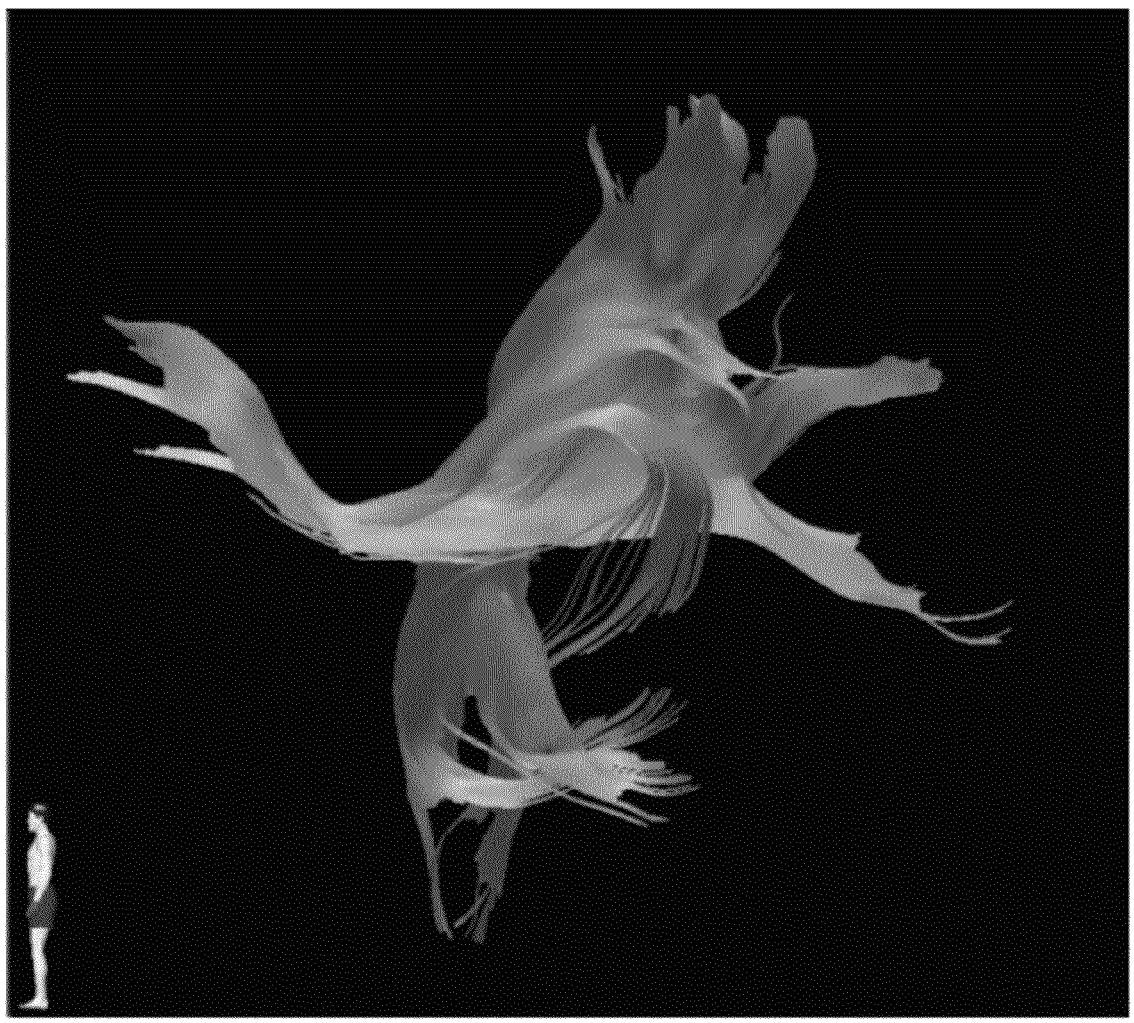
FIG. 13 is an image showing normal fiber thickness.
Figure 14:
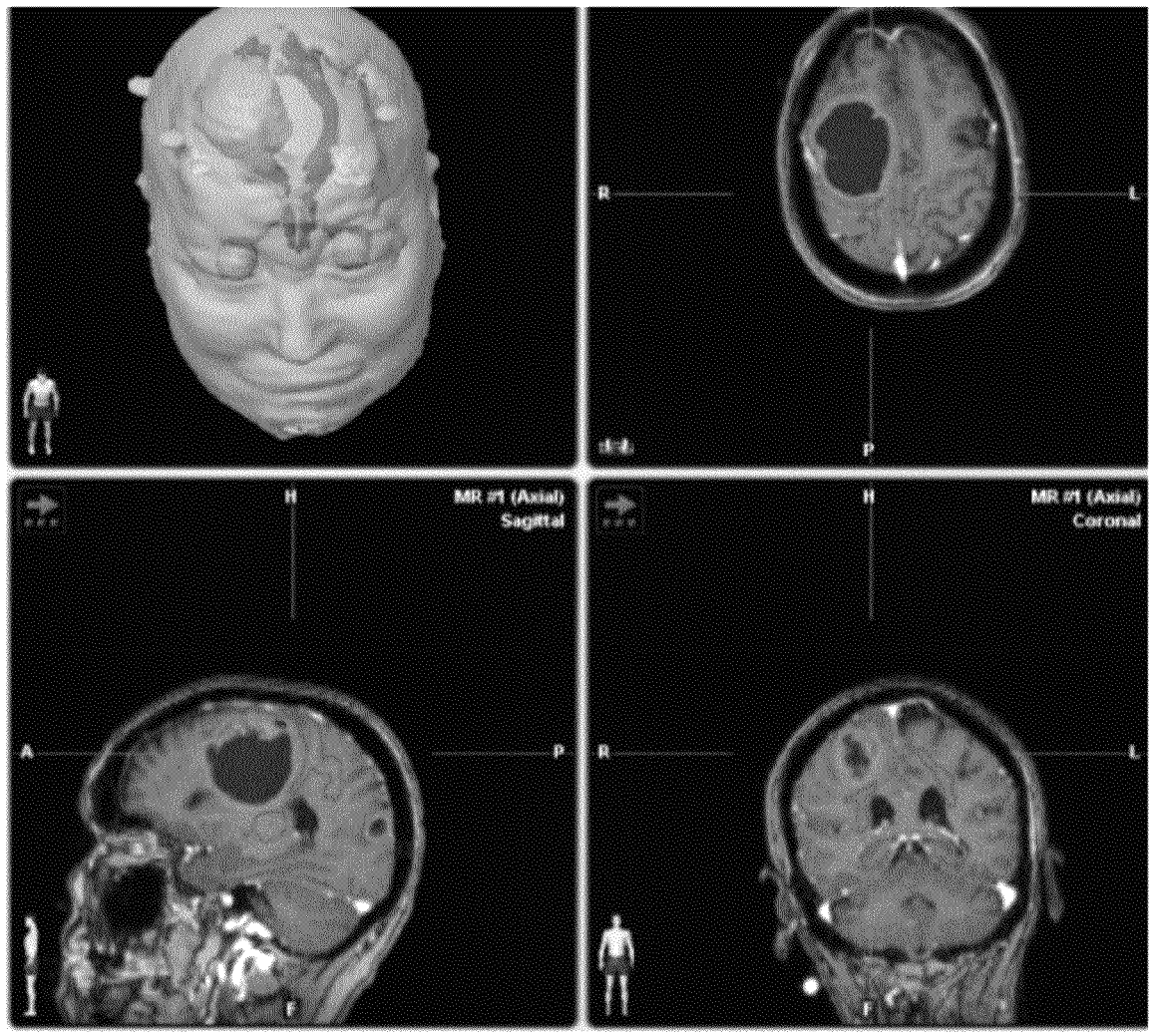
FIG. 14 is a series of MR images showing the displacement of fiber tracts in comparison to the normal side by a large tumor.
Figure 15:
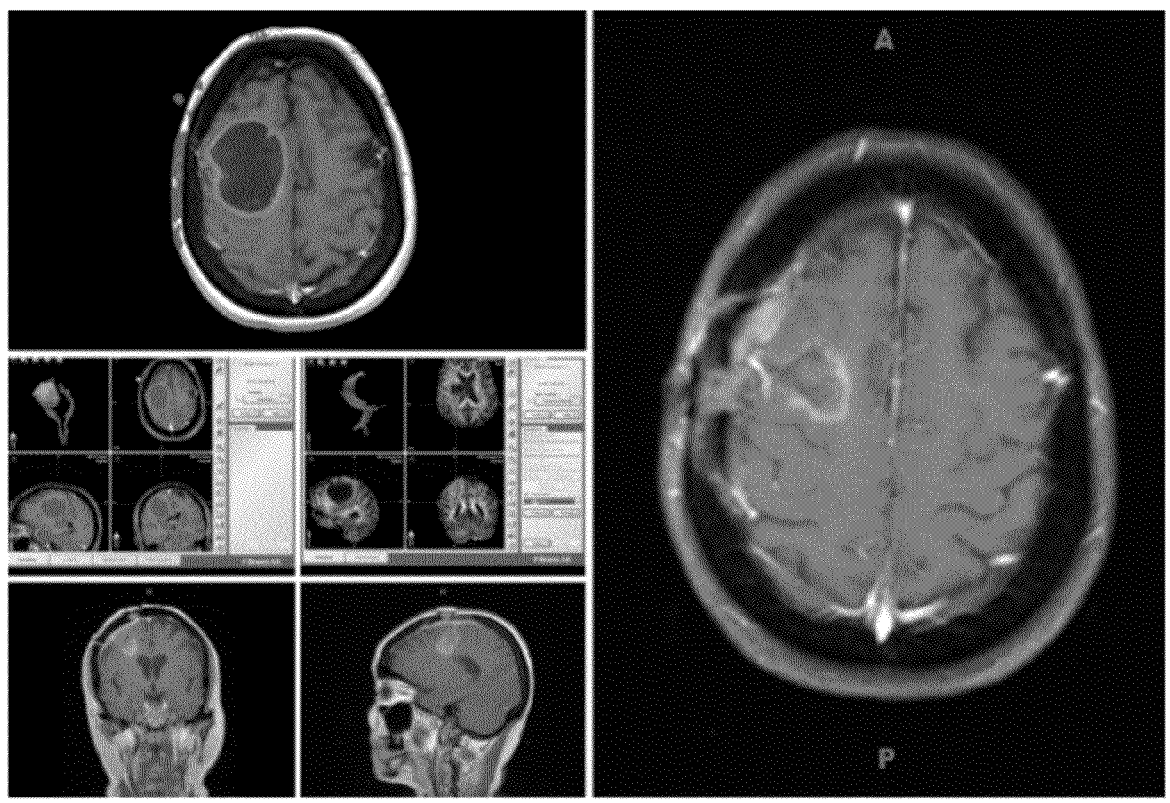
FIG. 15 is a series of preoperative and postoperative MR studies showing the gross total resection of the tumor.
Figure 16:
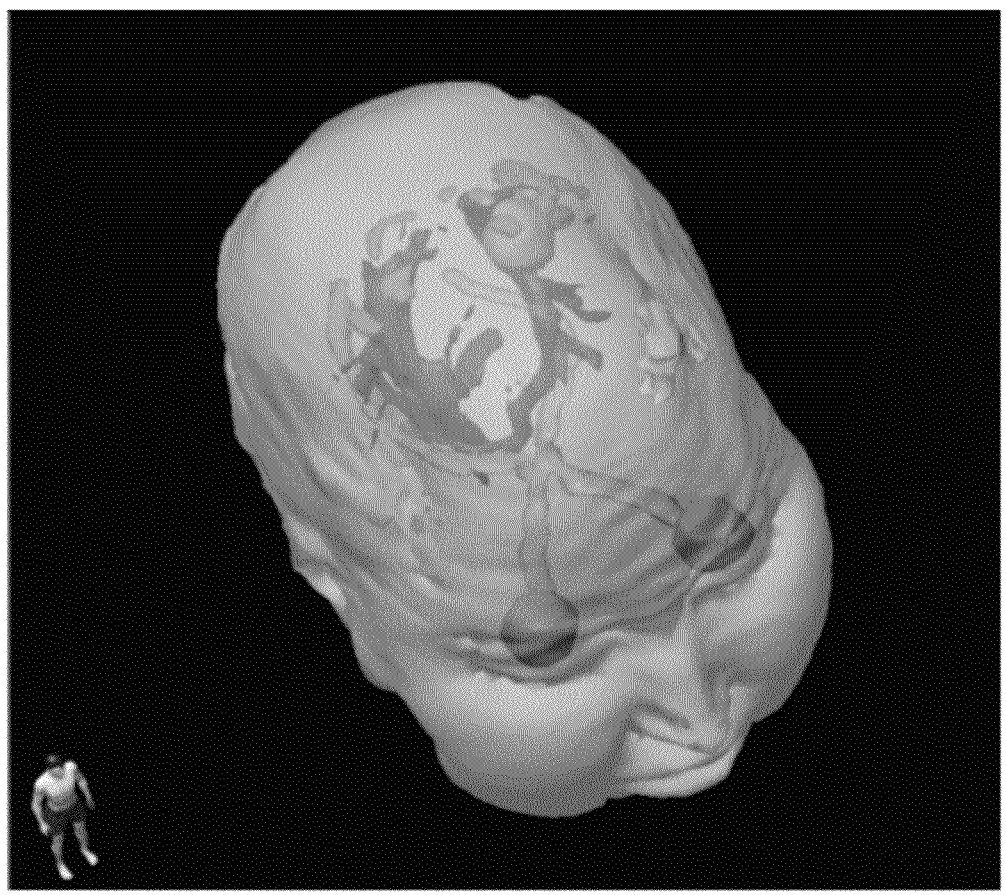
FIG. 16 is a three-dimensional DTI-BOLD fMRI—Intraoperative Electrophysiological Motor mapping integrated brain tumor surgery.
Figure 17:
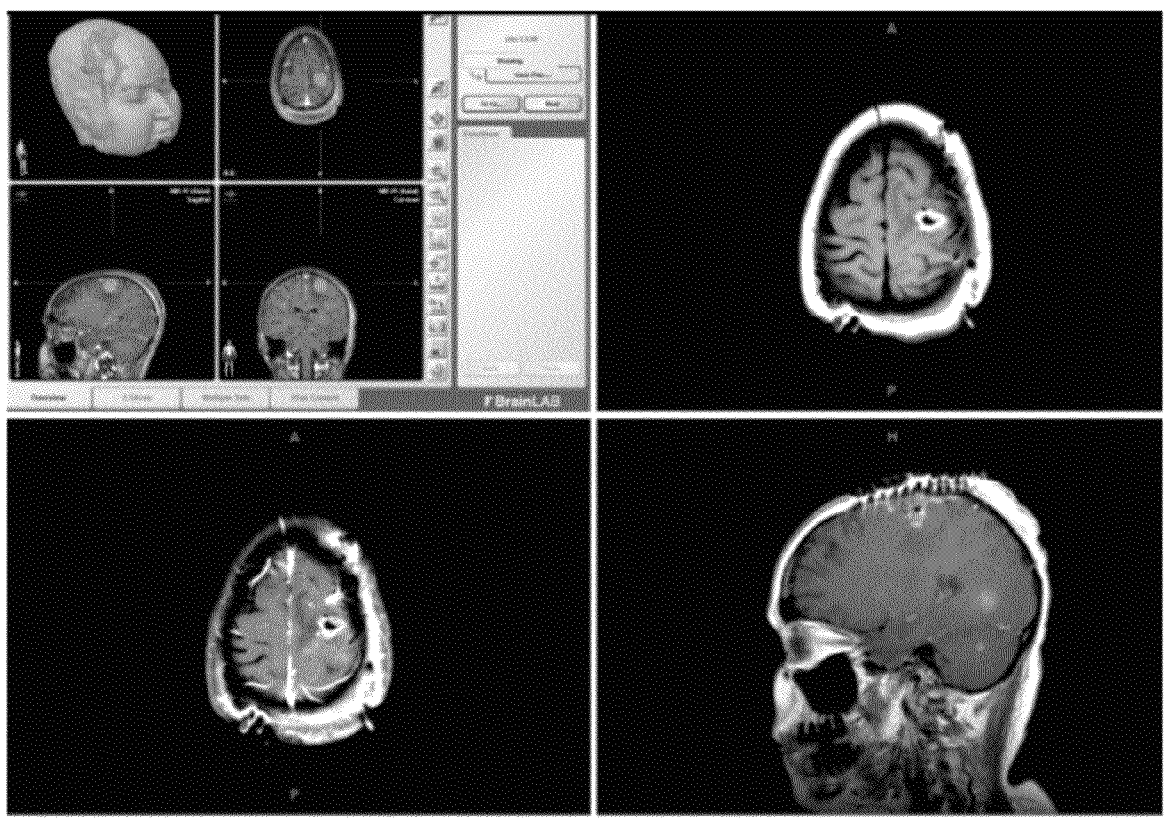
FIG. 17 is a series of preoperative and postoperative MR images showing the gross total resection of the tumor.
Figure 18:
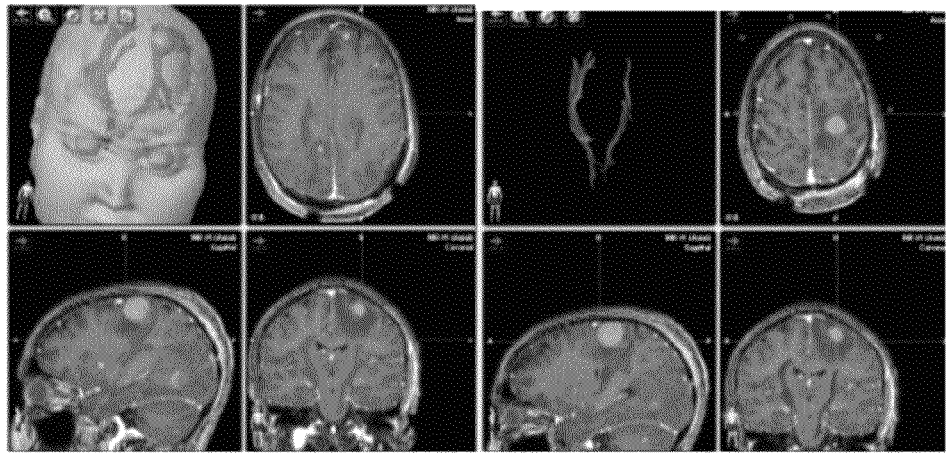
FIG. 18 is a series of images showing an A/B eloquent brain tumor, the compression of corticospinal fibers by the tumor, and edema.
Figure 19:
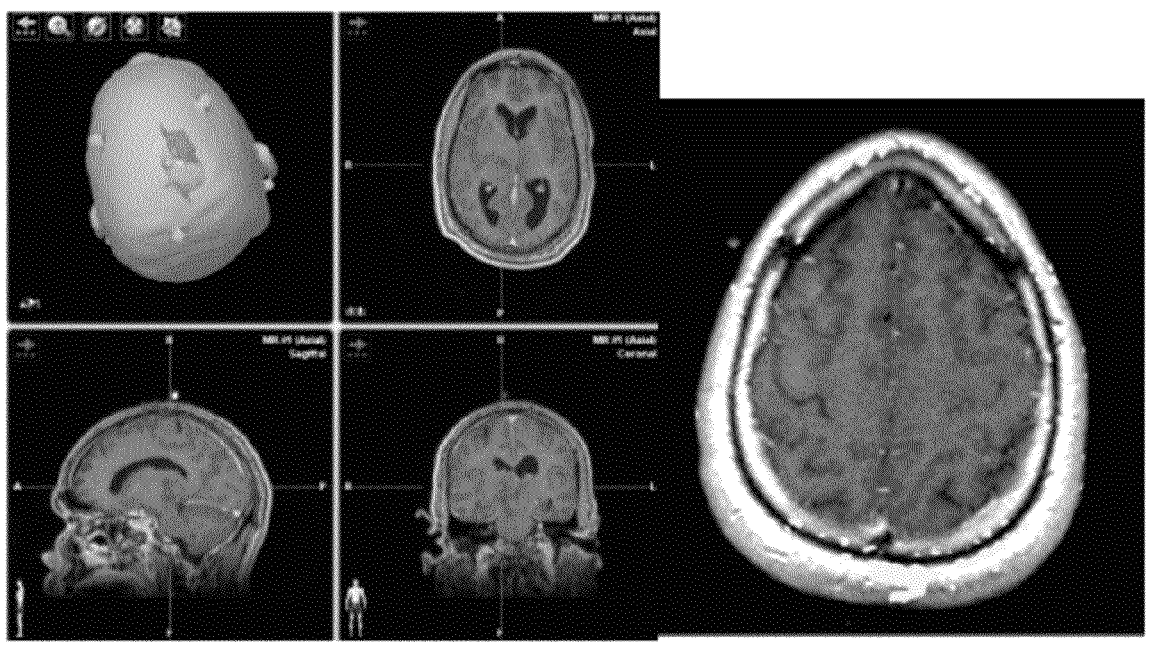
FIG. 19 is a series of preoperative three-dimensional DTI-SSEP/MEP integrated real-time navigation.
Figure 20:
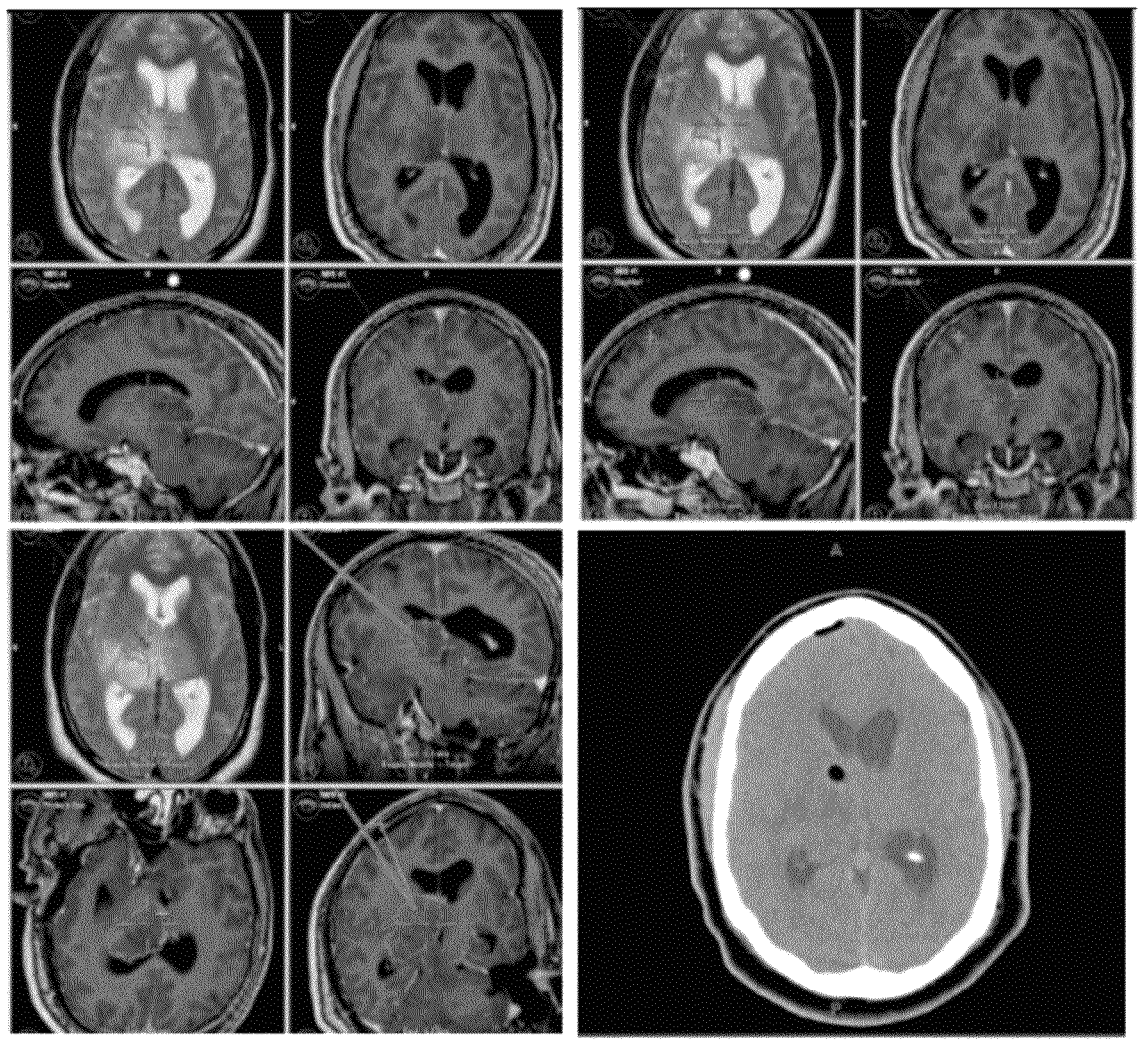
FIG. 20 is a series of DTI-fMRI-SSEP/MEP, which help in selecting ideal biopsy location in eloquent areas.
Figure 21:
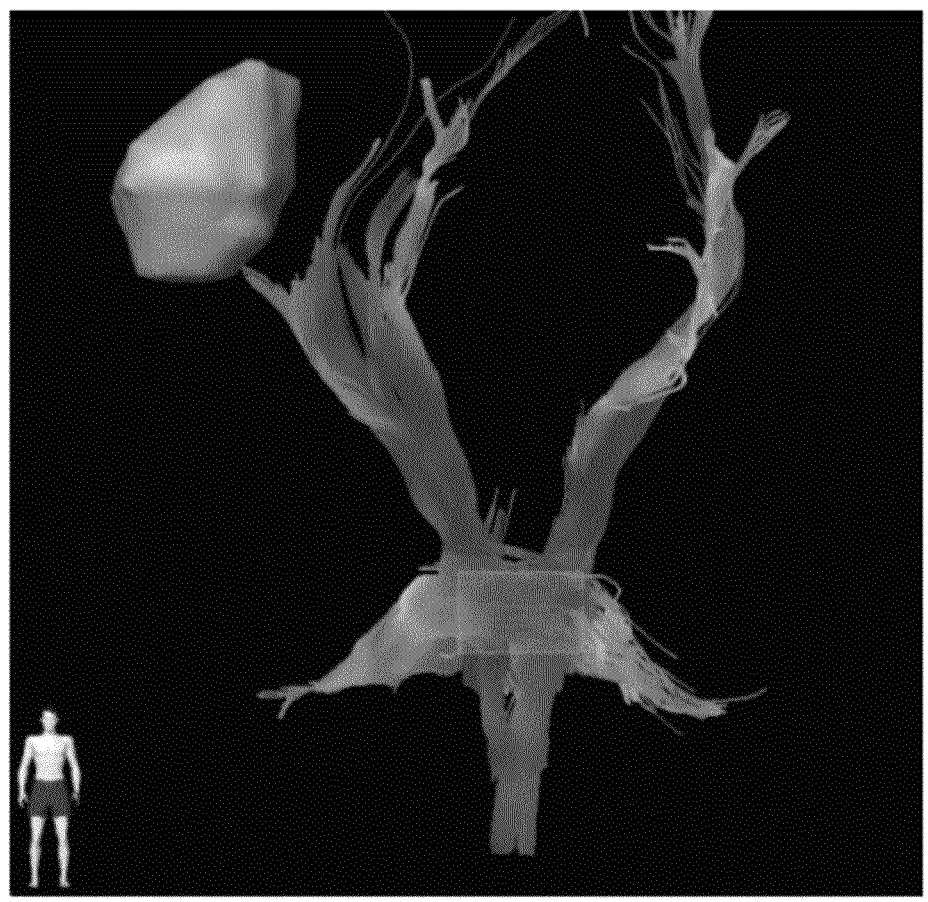
FIG. 21 is an image showing the WM-fiber tract disruption from Grade IV Glioblastoma.
Figure 22:
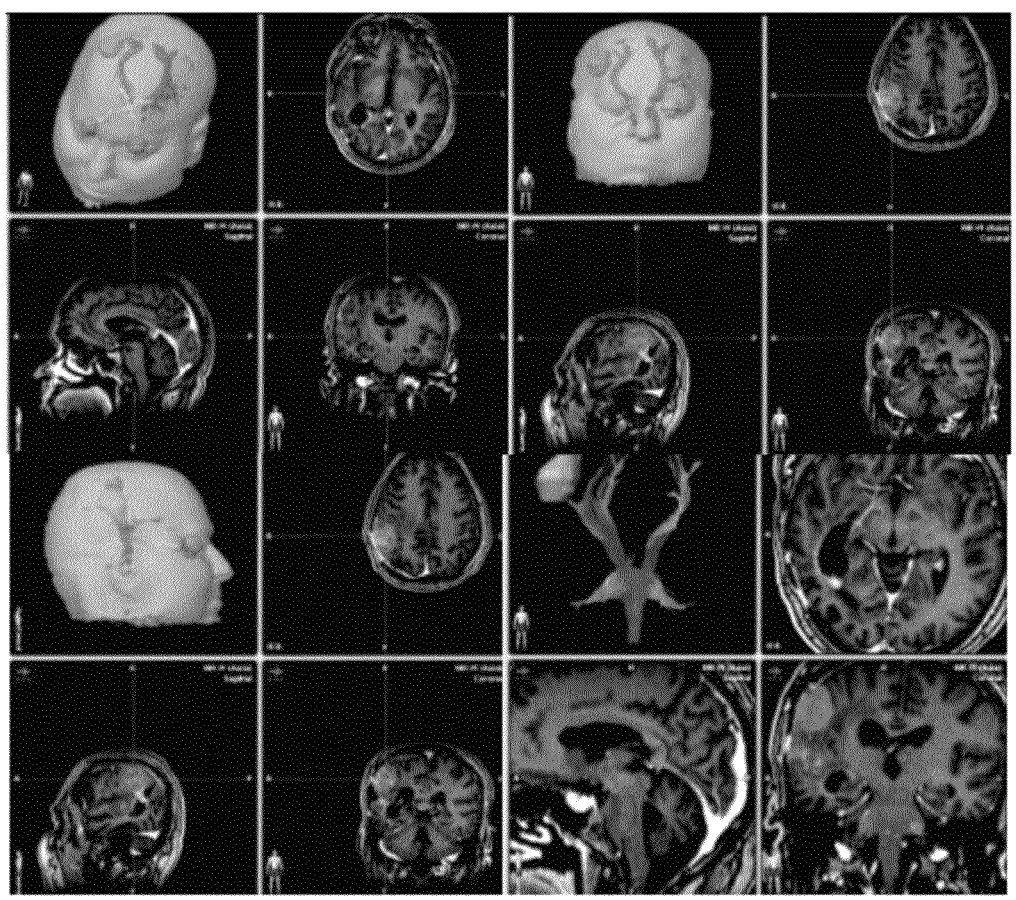
FIG. 22 is a series of images showing type 'C' subcortical tracts, WM tracts that run at least one cm away from the tumor margin.
Figure 23:
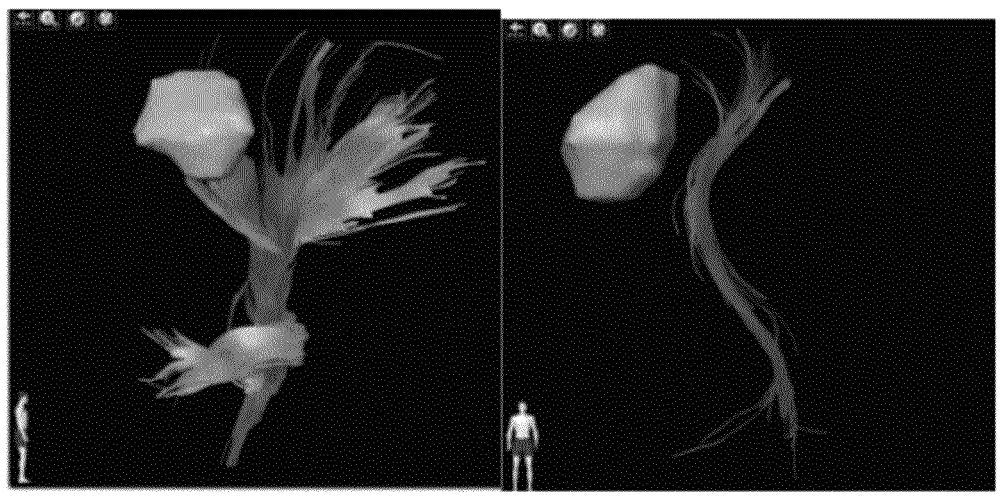
FIG. 23 is a pair of images showing the three-dimensional relationship of WM tracts with tumor size and location.
Figure 24:
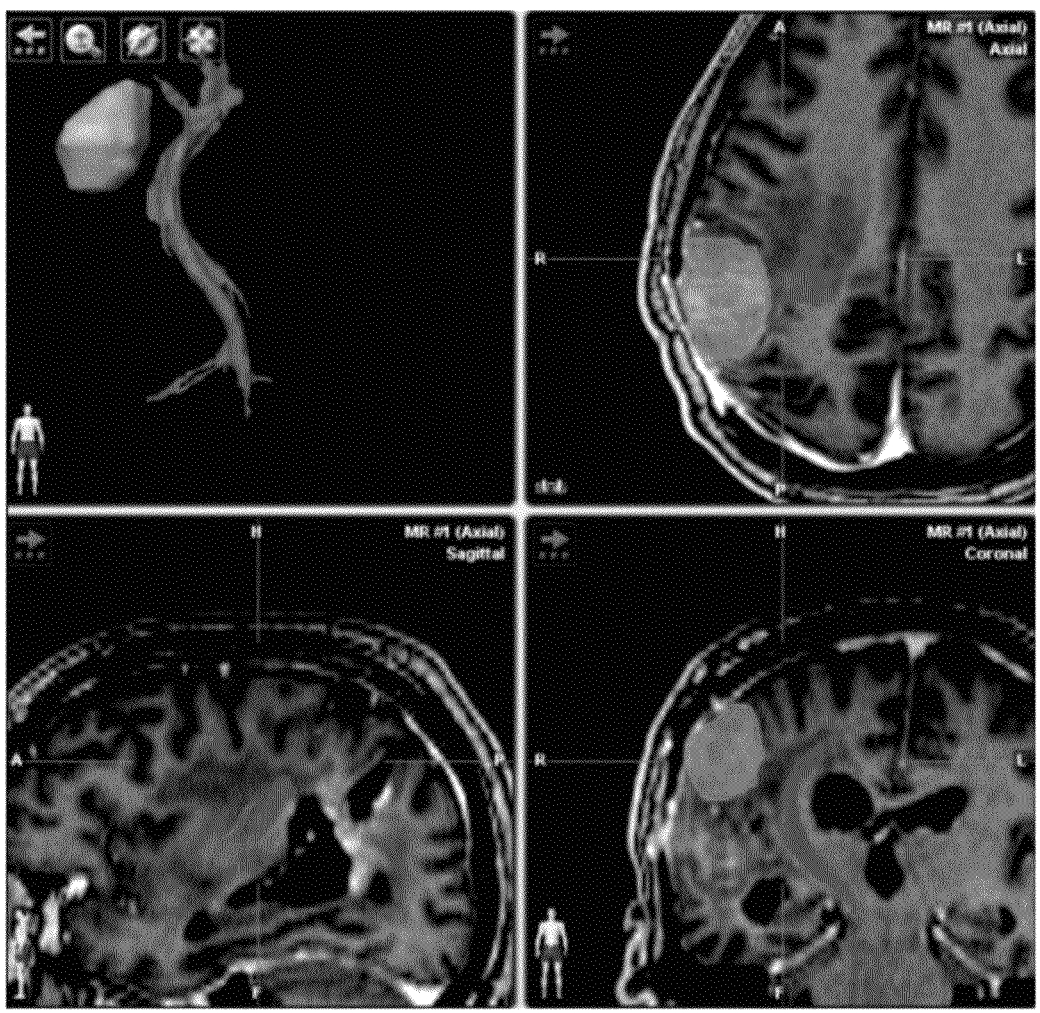
FIG. 24 is a series of images showing the location of WM-fiber tract and the tumor.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The fiber tracking process using a software program such as BrainLab's iPLAN® involves the use of three different steps to derive variables:
1) Determination of the Fractional Anisotropy (FA) threshold value;
2) Measurement of the length of the fiber bundle to be tracked; and
3) Determination of the size and localization of the region of interest to isolate particular projection, association, and commissural fibers traversing in the X, Y, and Z planes in the brain. Unwanted fibers are then removed by exclusion while retaining the desired tracts.

iPLAN is used herein only as an exemplary software program in which the present invention can be utilized. Other diffusion tensor imaging (DTI) and fiber tracking (FT) software programs, such as Invivo's Dynasuite are also within the scope of the present invention. These software applications are deployed on a computer having a central processing unit, a storage device such as a hard disk drive and a display such as an LCD monitor. The software application may be delivered by Internet download, optical disc, or any other media delivery mechanism known to one of ordinary skill in the art.

For FA threshold and fiber length, neither the manufacturer of iPLAN® (BrainLab™) nor the profession of neurosurgery has specified values/constants to reduce planning time significantly and simplify the technology and enhance its use. In fact, all other have used variables (not constants), which is time consuming (taking about four to six hours) and does not provide consistent results.

By determining a fixed FA constant (a physiological/anatomical 'set point') and fixed fiber length value, based on the type of fibers to be tracked, planning time is significantly reduced. In many cases planning time has been reduced to ten to twenty minutes. It is also important that the appropriate size and location of ROIs be placed in specific windows to track fiber pathways.

Optimum fiber bundles results were obtained when the FA threshold was entered at numeric value of 0.26 and minimal length for projection fibers was entered as 60 mms Although these values were found to be optimum, values near these are also within the scope of the present invention. For example, an FA threshold of 0.25 or 0.27 and minimal length for projection fibers of 59 or 61 are within the scope of the present invention.

By placing sub-centimeter size region of interests (ROIs) covering only the anatomical path of particular fiber bundles, such as corticospinals, corticobulbar and corticopontine fibers, planning time is further reduced with minimal need to perform the tedious exclusion of unwanted fibers.

Increasing or decreasing FA values to a value other than 0.26 failed to maintain optimum fiber bundles, caused the loss of some fibers, or added unwanted fibers in the region. In other words, values other than 0.26 either decreased "signal" (fiber tract of interest) or increased "noise" (background, irrelevant fiber tracts). Similarly, an alteration of fiber length from the value of 60 mm was not beneficial.

The present method has been used in over 200 surgeries and has provided consistent results. Selected exemplary results are described in the examples below.

EXAMPLE 1

(FIGS. 1-3)

Patient: 45-year-old male, right-handed with Broca's area type 'A' cortical lesion.
Preoperative Status: Seizure disorder with intermittent speech arrest and word finding difficulties.
Procedure: DTI-FT, f-MRI BOLD SPPECH Mapping, intra-operative somatosensory evoked potential (SSEP) studies.
Alternative approach: Awake craniotomy. Patient refused to undergo awake procedure.
DTI Data: superior longitudinal fasiculus (SLF), inferior longitudinal fasiculus (ILF) uncinate fasiculus (UNC) reconstructed. Infiltration of speech fibers along medial wall of tumor. Type ' A' subcortical tumor presentation. Fiber tracts displayed along ¾ wall of the tumor except a 5 mm area in the wall superiorly where fibers were not present.
BOLD Data: Speech cortex infiltrating the tumor.
Outcome: 5 mm opening made after initial transsulcal approach. Subtotal resection achieved. Significant improvement in speech after surgery. No new postoperative deficits. Seizures well controlled.
Impression: More clinical data to compare DTI integrated surgery verses awake craniotomy.

EXAMPLE 2

(FIGS. 4-6)

Patient: 81-year-old male, right-handed with frontal PS type 'B' motor cortex and type 'B' subcortical newly diagnosed GBM.
Preoperative Status: No motor weakness from lesion.
Procedure: DTI-FT, f-MRI BOLD MOTOR mapping, and intraoperative electrophysiological motor mapping studies integrated with MR based neuronavigation.
DTI-Results: Type 'B' subcortical CST presentation. Fiber tracts displaced by tumor bulk without associated disruption. All fiber tracts appear posterior, inferior, and lateral to tumor in 3D plane.
BOLD Data: Motor cortex displaced laterally.
Outcome: DTI data helped in surgical planning and a gross total resection achieved with postoperative deficits.
Impression: Postoperative DTI study is helpful to analyze and quantify change in fiber tracts characteristics in response to tumor resection and thereby, predict prognosis.

EXAMPLE 3

(FIGS. 7-11)

Patient: 31-year-old, newly diagnosed, Rt. Frontal non-enhancing type 'B' cortical, type 'A' subcortical lesion Preoperative Status: Seizure disorders. No motor deficits.

Procedure: Integrated DTI-FT, fMRI BOLD MOTOR mapping and Intraoperative electrophysiological motor mapping studies.

DTI Results: Type 'A' subcortical presentation. CBT+CST Tract displacement noted. Fiber tract involvement/infiltration long medial wall of tumor notice. Fiber tract thickness comparable to normal side suggestive of no disruption of fibers.

BOLD Studies: Type 'B' Primary motor cortex association with the tumor, confirmed by intraoperative electrophysiological motor mapping.

Outcome: Near total resection achieved with cautious resection along medical wall of the tumor. No postoperative deficits.

Impression: Postoperative DTI is helpful in studying change in degree of displacement in the fiber tracts and its correlation with the clinical status of the patient.

EXAMPLE 3

(FIGS. 12-15)

Patient: 78-year-old female with metastatic brain tumors: type 'C' cortical, type 'B' subcortical tumor.

Preoperative Status: Headaches. No deficits. KPS 90.

Procedure: DTI-FT, f MRI BOLD SPEECH-Motor mapping, Intraoperative electrophysiological motor mapping studies.

DTI results: Type 'B' subcortical tumor. Fiber tracts displaced posteriorly by the tumor.

BOLD results: Type 'C' cortical tumor. Speech reflected to the left brain.

Outcome: Gross total resection of tumor achieved. No postoperative deficits.

Impression: Lack of neurological deficits suggests displacement of motor fibers in the subcortical plane rather than compression by the tumor. Postoperative DTI is helpful in validating this finding.

EXAMPLE 4

(FIGS. 16-18)

Patient: 26-year-old female with metastatic melanoma: type 'A' cortical, type B' subcortical CST tumor.

Preoperative Status: Distal right hand weakness.

Procedure: DTI-FT, fMRI (BOLD study), intraoperative electrophysiological motor mapping studies.

DTI Results: Type 'B' subcortical tumor. CST compressed by tumor and edema.

BOLD Results: Type 'A' primary motor cortex lesion.

Outcome: Surgical trajectory planned based on BOLD-DTI mapping. GTR achieved. No new postoperative deficits. Patient's weakness improved significantly, which suggests compression instead of destruction of fibertracts. Postoperative DTI study is beneficial to compare.

EXAMPLE 5

(FIGS. 19-20)

Patient: 54-year-old male, right-handed, newly diagnosed right thalamic-capsular non-enhancing lesion, type 'A' subcortical tumor.

Preoperative status: cognitive disturbances, left hand clumsiness

Procedure: DTI-FT, fMRI motor Overlay, intraoperative somatosensory evoked potential and motor evoked potential study.

DTI results: Type 'A' subcortical tumor. 3D orientation of CST and thalamocortical fibers within high T2 signal lesion.

SSEP/MEP data: Biopsy location selected away from CST tracts and thalamocortical fibers. Patient had no SSEPs in LLE, No motor evoked potentials (MEPs) in left arm. Accuracy of Intraoperative real-time navigation was confirmed by postoperative CT.

Outcome: Anaplastic Astrocytoma; No postoperative deficits.

EXAMPLE 6

(FIGS. 21-25)

Patient: 48-year-old male, right-handed; Recurrent right frontal GBM (Type C/C premotor cortical and subcortical Corticospinal & Corticobulbar tracts. Patient presented with worsening contralateral motor strength prior to third stage craniotomy.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between.

What is claimed is:

1. A non-transitory computer readable medium for performing a method by running a software program on a computer, the computer readable medium comprising instructions for a computer to transform magnetic resonance imaging data into a visualization of neural pathways in the brain for tractography by diffusion tensor imaging or fiber tracking, the instructions comprising:

obtaining a magnetic resonance imaging data representing a first plurality of brain fiber tracts;

accessing a plurality of variable fields within the software, the variable fields including a fractional anisotrophy ratio field and a fiber length field;

setting the fractional anisotropy ratio field to a constant of about 0.26;

setting the fiber length field to a constant of about 60 mm;

determining positional coordinates and orientations of the first plurality of brain fiber tracts by applying the constants set for the fractional antisotrophy ratio and the fiber length fields to the magnetic resonance imaging data;

generating an electronic image representing the first plurality of brain fiber tracts using the calculated positional coordinates and orientations thereof; and outputting the electronic image in a visual form.

2. The computer readable storage medium of claim 1 further comprising instructions for setting a region of interest to a sub-centimeter size.

3. The computer readable storage medium of claim 1 further comprising instructions for placing sub-centimeter sized regions of interest to cover an anatomical pathway of projection fibers.

4. The computer readable storage medium of claim 1, wherein the first plurality of brain fiber tracts belongs to a predefined fiber bundle.

5. The computer readable storage medium of claim 4, wherein the fiber bundle is selected from the group consisting of commissural, association, and projection fibers.

6. The computer readable storage medium of claim 4, wherein the fiber bundle comprises corticospinal, corticobulbar, or corticopontine fibers.

7. The computer readable storage medium of claim 1, wherein the electronic image is displayed on a monitor.

* * * * *